United States Patent [19]
Brandlein et al.

[11] 3,838,203

[45] Sept. 24, 1974

[54] INSERTABLE ELECTRICAL TERMINATION MOUNTING

[75] Inventors: James D. Brandlein; Max E. Potter, both of Indianapolis, Ind.

[73] Assignee: Western Electric Company, Incorporated, New York, N.Y.

[22] Filed: July 3, 1973

[21] Appl. No.: 376,257

[52] U.S. Cl. .................... 174/68.5, 29/625, 29/626, 317/101 CC, 339/17 C, 339/221

[51] Int. Cl. .............................................. H05k 1/02

[58] Field of Search.... 174/68.5; 317/101 B, 101 G, 317/101 CC, 101 R; 339/18 R, 18 B, 275 B, 221, 17 R, 17 C; 29/625, 626

[56] References Cited

UNITED STATES PATENTS

| | | | |
|---|---|---|---|
| 3,155,767 | 11/1964 | Schellack | 174/68.5 |
| 3,374,305 | 3/1968 | Bower | 174/68.5 |
| 3,469,018 | 9/1969 | Arny | 174/68.5 |
| 3,693,052 | 9/1972 | Galanti | 174/68.5 X |

FOREIGN PATENTS OR APPLICATIONS

| | | | |
|---|---|---|---|
| 316,909 | 8/1929 | Great Britain | 339/17 R |

*Primary Examiner*—Darrell L. Clay
*Attorney, Agent, or Firm*—D. D. Bosben

[57] ABSTRACT

A substrate and an electrical termination mounting in the form of a connector strap are constructed so that the strap can be accurately pressed into position on the substrate to establish a circuit path thereon without deformation of the strap, so as to locate preformed electrical termination-receiving apertures in the strap and the substrate in axial alignment. Initially, axes of first securing elements on the connector strap and the substrate are aligned to locate the apertures in the strap radially with respect to the aligned axes, and second securing elements on the strap and the substrate are aligned to locate the apertures in the strap circumferentially about the aligned axes, thereby aligning respective ones of the apertures in the strap and the substrate. The strap then is pressed into a secured position on one side of the substrate, after which conductor wires or component leads may be inserted through respective aligned apertures in the strap and the substrate from the opposite side of the substrate, and soldered to the strap.

11 Claims, 9 Drawing Figures

PATENTED SEP 24 1974 3,838,203

SHEET 1 OF 3

PATENTED SEP 24 1974

3,838,203

SHEET 3 OF 3

INSERTABLE ELECTRICAL TERMINATION MOUNTING

BACKGROUND OF THE INVENTION

1. Field of the Invention

This invention relates to an insertable electrical termination mounting, and more particularly to a connector strap which is capable of being readily and accurately pressed into a substrate to establish a circuit path thereon, and which is of rigid durable construction so as not to be susceptible to thermal or physical damage during the soldering of leads thereto.

2. Prior Art

It is standard practice in the manufacture of electrical circuit modules to form circuit patterns on a substrate utilizing printed circuit techniques. This involves forming an electrically conductive metal layer on one side of the substrate, printing the desired circuit pattern on the metal layer in the form of circuit paths and associated land areas, etching away the metal material between the paths and land areas of the circuit pattern, and drilling holes through the substrate at the centers of the land areas. Subsequently, conductor wires and/or the leads of electrical components are inserted through the drilled holes in the substrate from its opposite side and are soldered to the land areas in a suitable manner, such as by passing the substrate over a solder fountain.

The forming of a circuit pattern by printed circuit techniques as above-described generally is quite expensive, and therefore undesirable in many instances, particularly where the circuit involved is relatively simple in configuration. Further, the formed circuit paths and land areas, which are of relatively thin foil-like material, are frangible in nature and it is difficult to solder conductor wires or component leads to the land areas without thermal and/or mechanical damage to the printed circuit.

While U.S. Pat. No. 3,155,767, issued Nov. 3, 1964 to H. F. Schellack, discloses various arrangements for forming circuit paths on a substrate with preformed electrically conducting bus bars or strap members, each of the disclosed arrangements, with one exception, requires an additional bending or forming operation to secure the strap member to the substrate after the strap member has been positioned thereon. In each instance, the conductor wires or component leads also are extended through apertures in the substrate which are laterally spaced with respect to the strap members, and then bent over to engage the strap members, making it difficult to obtain secure electrical connections of the wires or leads to the strap members. Further, the strap members extend completely through the substrate so as to project from its opposite side, where they can produce interference with the mounting of components and the routing of wires on the opposite side of the substrate.

SUMMARY OF THE INVENTION

The invention contemplates a press-in electrical termination mounting having a substantially planar body or strap member from which extends a first orthogonally projecting cleat for insertion in a pilot hole formed in a substrate. The insertion of the first cleat in the pilot hole radially positions electrical termination-receiving means on the body member with respect to the center of the pilot hole. The body member is further accurately located on the substrate by a pair of locating surfaces on the body member which cooperate with a complementary pair of locating surfaces on the substrate so that the electrical termination-receiving means is precisely located on the substrate. In one instance the body member locating surfaces are formed by a pair of orthogonally projecting second cleats which fit into a pair of holes or slots formed in the substrate so that the opposed inner surfaces of the cleats may be force-fitted against inner surface walls of the slots. In another instance, the body member locating surfaces take the form of opposed surfaces of a slot fabricated in the body member, which slot surfaces cooperate with surfaces of a projection extending from the substrate. The termination receiving means may be one or more preformed apertures in the body member alignable with preformed apertures in the substrate, and through which aligned apertures, conductor wires or component leads may be extended from the opposite side of the substrate and soldered to the body member.

DETAILED DESCRIPTION

Figure 1:
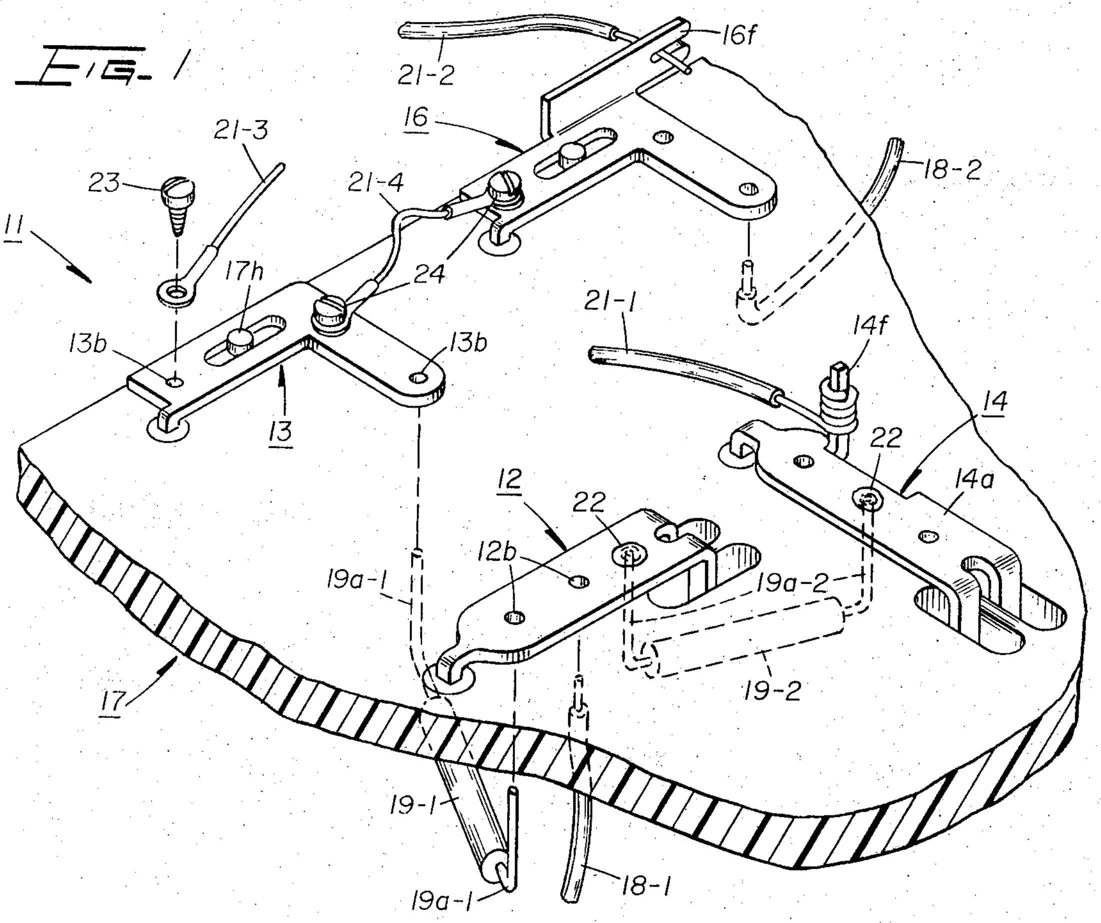
FIG. 1 is an isometric view of a portion of a terminal block assembly utilizing press-in connector straps in accordance with this invention.

FIG. 1 illustrates, by way of example, a portion of a circuit module or terminal block assembly 11 in which a plurality of electrical termination mountings in the form of connector straps 12, 13, 14 and 16 of different configurations in accordance with the invention, are mounted on a substrate 17 and utilized to electrically connect various conductor wires 18-1 and -2, and leads **19*a*-1 and -2 of electrical components 19-1 and -2 beneath the substrate, as well as various conductor wires 21-1, -2, -3 and -4 above the substrate. The connector straps 12, 13, 14 and 16 are of a suitable electrically conducting material, such as solder-coated brass, which may conveniently be formed from sheet stock in a progressive punch and die, and the substrate 17** is of a suitable insulating material, such as molded ceramic or plastic.

Figure 2:
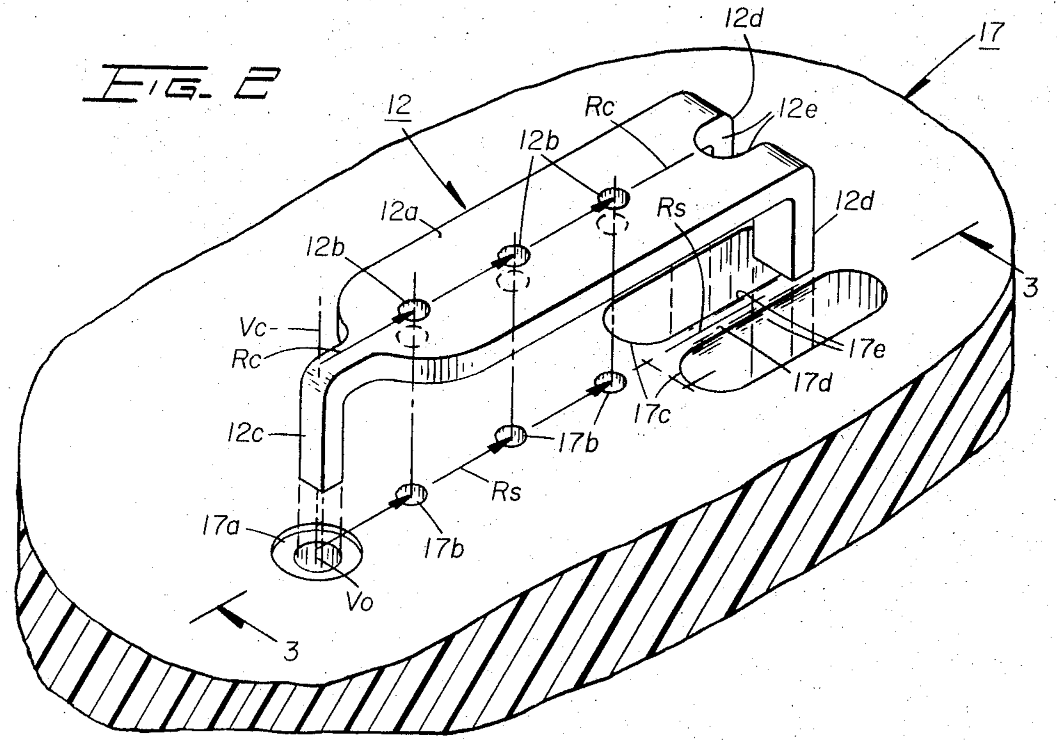
FIG. 2 is an enlarged isometric view of one of the connector straps shown in FIG. 1, prior to its assembly to a substrate.

Referring to FIG. 2, which shows the electrical termination mounting or connector strap 12 prior to its assembly to the substrate 17, it is seen that the connector strap includes a planar intermediate body portion 12*a* having a row of electrical termination-receiving apertures 12*b* preformed therethrough. Adjacent one end of the planar body portion 12*a* the connector strap 12 is provided with a securing element in the form of an orthogonally extending rectangular cleat 12*c* projecting downwardly and perpendicular to the body portion, and adjacent the opposite end of the planar body portion the connector strap is provided with a pair of laterally spaced and orthogonally projecting cleats 12*d*. The electrical termination-receiving apertures 12*b* are located respective preselected distances from a vertical central axis V*c* of the first cleat 12*c* along an imaginary straight radial line R*c* corresponding generally to the longitudinal axis of the connector strap 12, and opposed inner surfaces 12*e* of the pair of cleats 12*d* are located symmetrically on opposite sides of the radial line, which extends therebetween.

Similarly, the substrate 17 includes an inverted bell-shaped circular pilot opening or hole 17*a* for receiving the rectangular cleat 12*c* of the connector strap 12, with a vertical central axis V*o* of the opening extending perpendicular to opposite sides of the substrate. The substrate 17 also has a plurality of preformed electrical termination-receiving apertures 17*b* located along a radial line R*s* the same preselected distances from the vertical axis V*o* or center of the opening as the apertures 12*b* in the connector strap 12 are located along the radial line R*c* from the vertical axis V*c* of the cleat, the radial lines R*s* and R*c*, when vertically aligned, defining a desired linear orientation of the connector strap 12 on the substrate. A pair of elongated holes or slots 17*c* are provided on opposite sides of the radial line Rs and define a saddle portion 17*d* symmetrical with respect to the radial line and having laterally spaced gripping surfaces 17*e* which extend parallel to the radial line to provide a range or "floating" location over which the pair of cleats 12*d* readily may be positioned in the slots in straddling gripping relationship to the saddle, without causing distortion or undesirable shifting of the connector strap 12 during an assembling operation. More specifically, the slots compensate for tolerance variations in the positions of the cleats 12*c* and 12*d* and allow the connector strap 12 to be inserted into the substrate without longitudinal distortion in the form of "buckling" or "stretching," as well as without the possible attendant shifting or "migrating" of the connector strap longitudinally, either of which conditions could cause the electrical termination-receiving apertures 12*b* in the connector strap to become misaligned with respect to the electrical termination-receiving apertures 17*b* in the substrate 17.

In assembling the connector strap 12 to the substrate 17, an operator positions the first cleat 12*c* in an outwardly flared portion of the inverted bell-shaped pilot opening 17*a* in an upper surface of the substrate, so that the flared portion of the opening locates the vertical axes V*c*, V*o* of the cleat and the opening substantially in alignment. The connector strap 12 then is pivoted about the aligned vertical axes V*c*, V*o* of the cleat 12*c* and the pilot opening 17*a*, as necessary, to position the pair of cleats 12*d* at the other end of the connector strap in openings defined by their respective elongated slots 17*d* in the upper surface of the substrate. The preformed electrical termination-receiving apertures 12*b* in the connector strap 12 now are substantially in vertical axial alignment with their respective preformed electrical termination-receiving apertures 17*b* in the substrate, with the bell-shaped pilot opening 17*a* locating the preformed apertures in the connector strap radially on lines (not shown) extending circumferentially of the aligned vertical axes V*c*, V*o* of the cleat 12*c* and the opening, and with the elongated slots 17*c* in the substrate locating the preformed apertures and the radial line R*c* in a desired linear orientation vertically above the radial line R*s* of the substrate.

Figure 3:
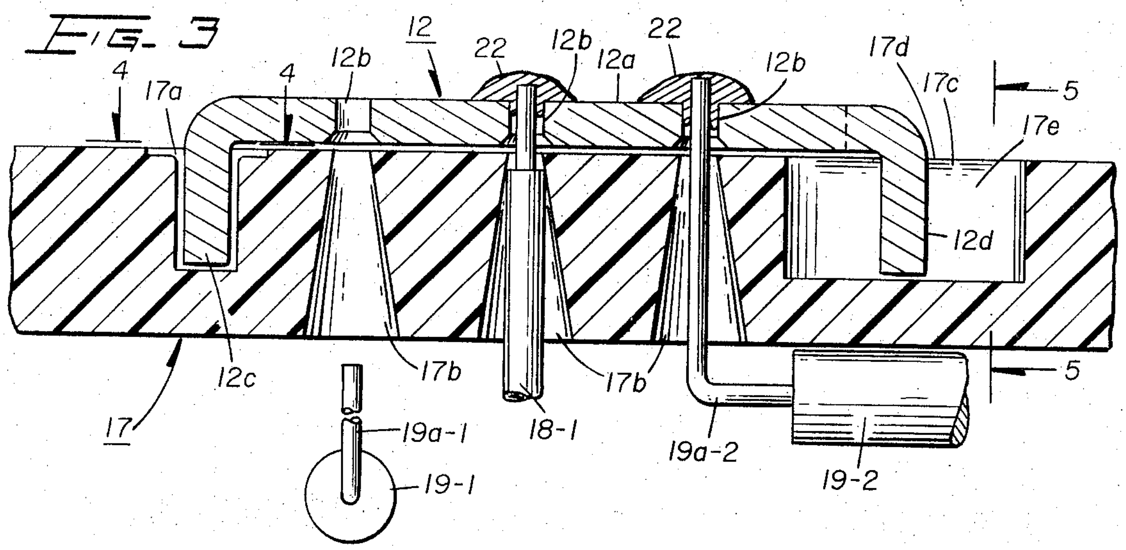
FIG. 3 is a cross-sectional view taken along the line 3—3 in FIG. 2 and illustrating the connector strap of FIG. 2 after it has been assembled to the substrate.
Figure 4:
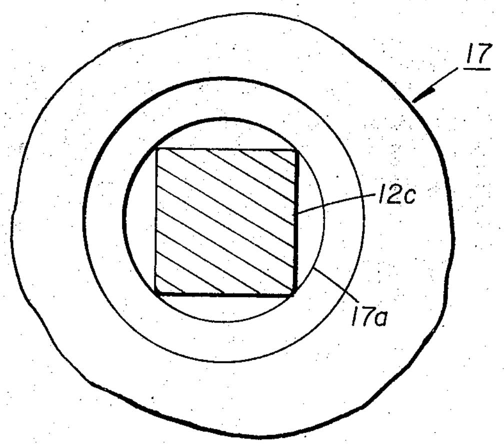
FIG. 4 is a cross-sectional view taken along the line 4—4 in FIG. 3.
Figure 5:
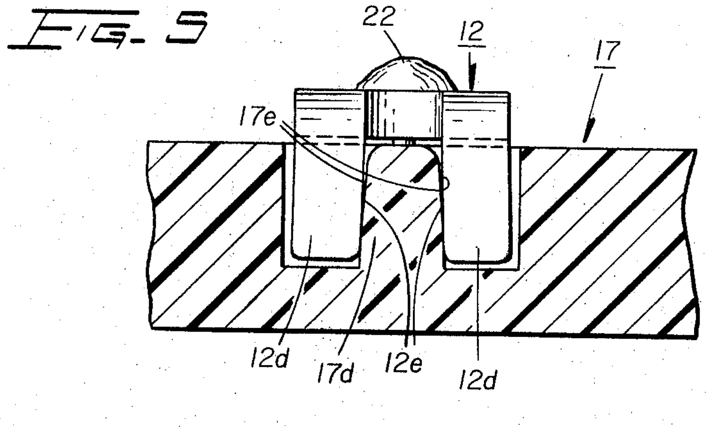
FIG. 5 is a cross-sectional view taken along the line 5—5 in FIG. 3.

The connector strap 12 then is pressed downward into a position closely adjacent the upper surface of the substrate 17, as illustrated in FIG. 3, with the first cleat 12*c* moving downward into a reduced cylindrical portion of the bell-shaped pilot opening 17*a*, and with the pair of cleats 12*d* at the other end of the strap moving downward into their respective elongated slots 17*c*. Referring to FIG. 4, it is seen that the rectangular first cleat 12*c* is slightly oversize with respect to the reduced cylindrical portion of the bell-shaped pilot opening 17*a*, so that as the cleat moves downward into the reduced cylindrical portion, the edges of the cleat defined by the intersections of its planar surfaces bite into the well of the opening, to secure the strap to the substrate, and to locate the vertical axis V*c* of the cleat on the vertical axis Vo of the bell-shaped opening, thus locating the electrical termination-receiving apertures 12*b* in the connector strap accurately with respect to the center of the opening on the above-mentioned lines (not shown) extending circumferentially of the aligned vertical axes. Similarly, referring to FIG. 5, it is seen that the spacing between the symmetrical opposed surfaces 12*e* of the pair of cleats 12*d* is slightly less than that between the laterally spaced symmetrical surfaces 17*e* of the substrate saddle portion 17*d*, whereby the cleats grip the spaced surfaces of the saddle portion tightly in self-centering relationship to secure this end of the connector strap 12 to the substrate and to locate the radial line R*c* and the electrical termination-receiving apertures 12*b* of the connector strap in vertical alignment with the radial line Rs of the substrate 17, whereby the apertures 12*b* are located in axial alignment with the electrical termination-receiving apertures 17*b* in the substrate 17. In pressing the connector straps 12 into the position shown in FIG. 3, the pressing operation may be accomplished on each connector strap individually in a suitable pressing device, or a plurality of the connector straps, after being properly positioned on the substrate, may be pressed into position simultaneously. In the alternative, the configuration of the connector strap cleats 12*c* and 12*d*, the substrate opening 17*a*, and the substrate saddle portion 17*d* may be constructed so that the connector strap 12 can be snapped into position on the substrate 17 manually.

After the connector straps 12, 13, 14 or 16 have been pressed into position on the substrate 17 as illustrated in FIG. 3, the various conductor wires 18 and components 19 are assembled on the opposite side of the substrate and connected to the connector straps. For example, as is illustrated in FIG. 3 for leads 19*a*-1 and 19*a*-2 of the electrical components 19-1 and 19-2, respectively, each lead is inserted from the opposite side of the substrate 17 through respective aligned apertures 12*b* and 17*b* in the connector strap 12 and the substrate, the aperture 17*b* in the substrate being conically-shaped and the bottom portion of the aperture 12*b* in the connector strap also having been coined during the fabrication thereof to a conical shape to form a continuation of the aperture 17*b*, to facilitate the passage of the lead therethrough. Similarly, as is illustrated in FIG. 3 by the conductor wire 18-1, each conductor wire 18 is inserted through its respective aligned apertures 12*b* and 17*b* in the connector strap 12 and the substrate 17. After the conductor wires 18 and the leads 19*a* of the components 19 have been assembled to the connector straps 12, 13, 14 or 16 and the substrate 17, the resultant assembly may be passed through a suitable soldering device to form solder connections 22 over their ends in a well known manner. Since the cleats 12*c* and 12*d* of the connector strap 12 need not extend completely through the substrate 17 in order to secure the connector strap 12 firmly thereto, as is apparent from FIG. 3, it is seen that the bell-shaped opening 17a and the slots 17c do not extend through the substrate and thus the cleats are shielded from the opposite side of the substrate, including the various conductor wires 18 and components 19 thereon, by intervening insulating material of the substrate.

Figures 6, 7, 8, 9:
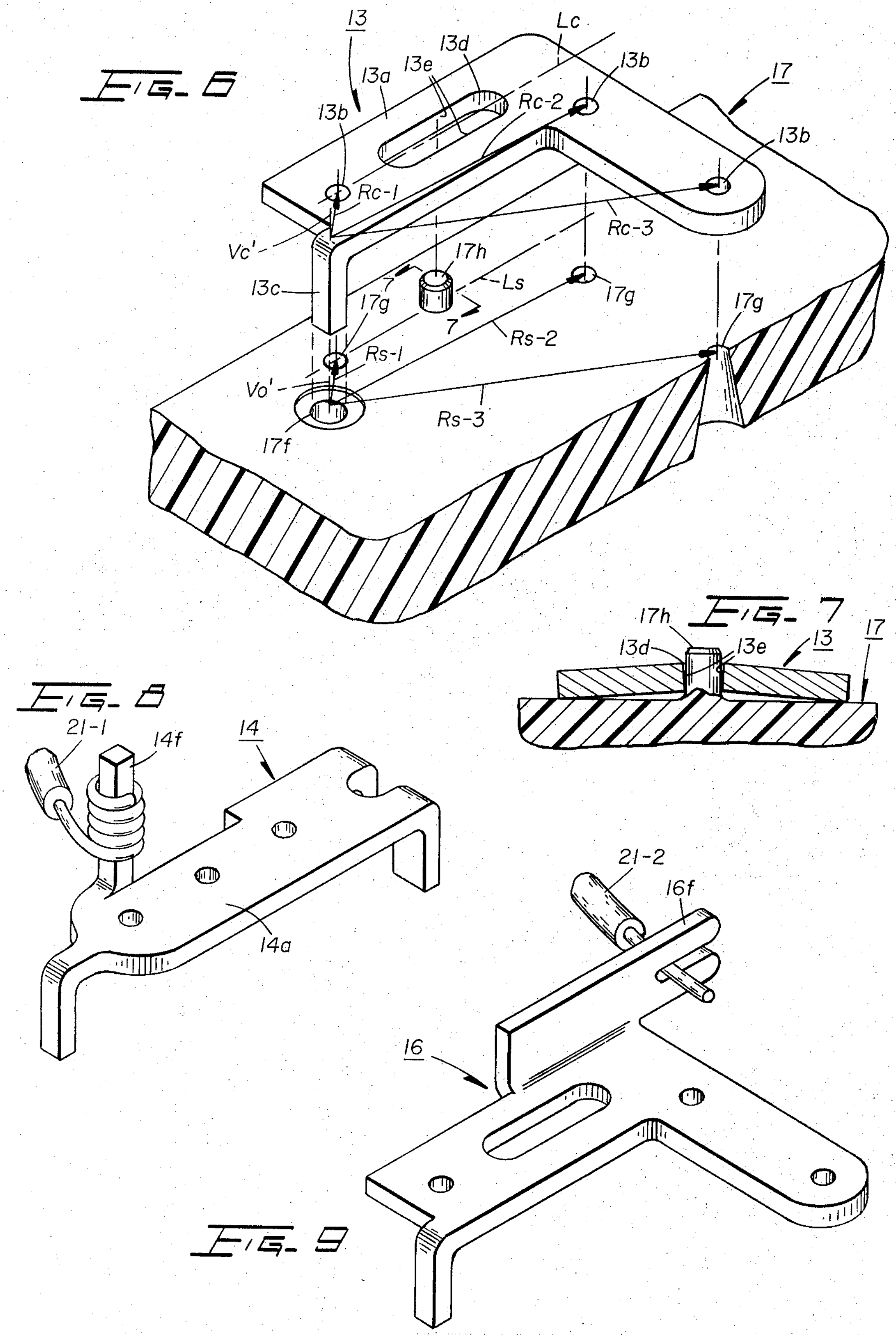
FIG. 6 is an enlarged isometric view of an alternate connector strap in accordance with the invention prior to its assembly to a substrate.
FIG. 7 is a cross-sectional view taken along the line 7—7 in FIG. 6 after the connector strap therein has been assembled to the substrate.
FIG. 8 is an enlarged isometric view of an alternate connector strap.
FIG. 9 is an enlarged isometric view of another alternate connector strap.

The connector strap 13 shown in FIG. 6, as in the connector strap 12 shown in FIG. 2, includes an elongated body portion 13*a* having a plurality of preformed electrical termination-reciving apertures 13*b* therethrough and having an orthogonally projecting rectangular cleat 13*c* which is receivable in an inverted bell-shaped pilot opening 17*f* in the substrate 17 in gripping relationship. In contrast to the connector strap 12, however, the preformed apertures 13*b* are located at preselected distances from a vertical axis or center V*c'* of the cleat 13*c* along respective radius lines R*c*-1, R*c*-2, and R*c*-3, instead of along a common radial line. Similarly, the substrate 17 has a plurality of preformed electrical termination-receiving apertures 17*g* located the same preselected distance from a vertical axis or center V*o'* of the bell-shaped pilot opening 17*f*, along respective radius lines R*s*-1, R*s*-2 and R*s*-3 corresponding to the radius lines R*c*-1, R*c*-2 and R*c*-3. Thus, the connector strap cleat 13*c* and substrate opening 17*f* function in the same manner as the connector strap cleat 12*c* and the substrate opening 17*a* in FIG. 2, to locate the connector strap 13 and its apertures 13*b* radially on lines (not shown) extending circumferentially about the aligned vertical axes V*c'* and V*o'* of the cleat and the opening.

The connector strap 13 also is constructed so that it may be utilized where space is at a premium, such as along the edge of the substrate 17 as illustrated in FIG. 1, or in intermediate locations on the substrate where the paired cleat construction of the connector strap 12 in FIG. 2 could not be utilized without one of the cleats 12*d* being exposed or being closely adjacent another connector strap on the substrate. Thus, in the connector strap 13 the paired cleats 12*d* of the connector strap 12 and the associated elongated slots 17*c* in the substrate 17 are replaced with an elongated slot 13*d* in the body portion 13*a* of the connector strap on its longitudinal axis L*c*, and an upward projection 17*h* on the substrate 17 which is receivable in the slot to secure the connector strap to the substrate 17, and so as to locate the radius lines R*c*-1, -2 and -3, and the preformed apertures 13*b* of the connector strap, in alignment with the substrate radius lines Rs-1, -2 and -3, and the preformed substrate apertures 17*g*, respectively. In this connection, opposed surfaces 13*e* of the strap 13 which define the elongated slot 13*d* are spaced apart a distance less than the diameter of the projection 17*h* so that when the connector strap is pressed downward over the projection, with the surfaces of the slot straddling the projection, the side portions of the strap defined by the slot are deflected slightly as illustrated in FIG. 7, and thus bite into surface portions of the projection to secure the connector strap to the substrate. The projection 17*h* also is located centrally on an imaginary straight line L*s*, the line L*s* and the longitudinal axis L*c* of the connector strap 13, when vertically aligned, defining the desired linear orientation of the connector strap on the substrate 17. Thus, as in the case of the substrate gripping surfaces 17*e* in FIG. 2, the opposed slot surfaces 13*e* also extend parallel to the longitudinal axis L*c* of the connector strap 13 so that the connector strap can readily be assembled to the substrate 17 without distortion or shifting of the strap which would cause the electrical termination-receiving apertures 13*b* and 17*g* to become misaligned during the assembling operation.

The illustrated terminal block assembly 11 in FIG. 1 also discloses various other embodiments of applicant's invention of different configurations. For example, the connector strap 14, which also is shown in FIG. 8, is similar to the connector strap 12 but has a part of a linear body portion 14*a* thereof formed upward to provide an upstanding electrical termination-receiving portion 14*f* to which the conductor wire 21-1 is connected by wire wrapping. The connector strap 16, which also is shown in FIG. 9, is similar to the connector strap 13 but is provided with a clip-type electrical termination-receiving portion 16*f* to which the conductor wire 21-2 is connected by inserting the wire between two laterally spaced gripping fingers. Further, the conductor wire 21-3 is connected to the connector strap 13 utilizing a terminal screw 23 threaded into respective electrical termination-receiving apertures 12*b* and 17*b* of the connector strap and the substrate 17, and connector straps 13 and 16 are shown as being interconnected by the conductor wire 21-4 and terminal screws 24 threaded into respective apertures of the connector straps and the substrate. Various other modifications and changes to the configurations of the connector straps 12, 13, 14 and 16 will be obvious to those skilled in the art.

In summary, press-in electrical termination-receiving mountings in the form of the connector straps 12, 13, 14 and 16, which are suitable for providing circuit paths on the substrate 17 as a substitute for a printed circuit pattern on the substrate, wherein the connector straps are economical to manufacture, capable of being readily and accurately assembled to the substrate without distortion or shifting, and of durable rigid construction whereby they are not susceptible to thermal or mechanical damage, have been disclosed. Each of the connector straps 12, 13, 14 and 16 also is capable of being anchored firmly to the substrate 17 without any portion of the strap extending through the substrate so as to interfere with the conductor wires 18 and the electrical components 19 on the opposite side of the substrate. Further, as a result of the conductor wires 18 and the leads 19a of the components 19 being passed through the substrate and directly through the apertured connector strap 12, 13, 14 and 16 to make electrical connection with the connector straps, the resultant soldered electrical connections 22 are of durable construction and less subject to breakage or damage than electrical connections heretofore attainable in prior art arrangements. The connector straps 12, 13, 14 and 16 also are capable of being fabricated in various configurations and utilized in various manners, and thus have a high degree of versatility insofar as their use in electrical assemblies is concerned.

What is claimed is:

1. An electrical circuit assembly, which comprises:

a substrate member having a first securing element;

an electrically-conductive strap member assembled to said substrate member and having a body with a second securing element in gripping engagement with the first securing element to secure said substrate and said strap members together, one of the securing elements being a pilot opening in its respective member and the other of the securing elements being a laterally projecting cleat on its respective member and received in the pilot opening in press-fit centered engagement therewith;

a pair of spaced gripping surfaces on said strap member straddling and bearing against a pair of spaced gripping surfaces on said said substrate, said pairs of spaced gripping surfaces being located on opposite sides of an imaginary straight line corresponding to a preselected linear orientation of said members, with one of the pairs of gripping surfaces extending parallel to the imaginary straight line in opposite directions a distance greater than the extent of the other pair of gripping surfaces; and a preformed aperture in said substrate member and a preformed aperture in said strap member in axial alignment with one another.

2. An electrical circuit assembly, as recited in claim 1, in which:

the pair of parallel extending gripping surfaces is defined by a saddle portion of said substrate located between a pair of elongated slots in said substrate; and the other pair of gripping surfaces is defined by a pair of spaced laterally projecting cleats on said strap member and received in the slots in said substrate in straddling gripping relationship with respect to the saddle portion of said substrate.

3. An electrical circuit assembly, as recited in claim 1, in which:

the pair of parallel extending gripping surfaces is defined by opposed sides of an elongated slot in said strap member; and the other pair of gripping surfaces is defined by a projection on said substrate received in the slot in said strap member in straddled tight-gripped engagement by the opposed sides of the slot in said strap member.

4. An electrical circuit assembly, as recited in claim 1, which further comprises:

an electrical termination extending through the aligned apertures in said substrate member and said strap member and secured to said strap member.

5. An electrical circuit assembly, as recited in claim 4, in which:

the electrical termination is an electrical lead extending through the aligned apertures in said substrate member and said strap member from the opposite side of said substrate member and secured to said strap member.

6. An electrical circuit assembly, as recited in claim 5, in which:

the pilot opening is in said substrate member, is cylindrical in configuration, and extends only partially through said substrate member perpendicular thereto;

the laterally projecting cleat is on said strap member and has orthogonally extending edge portions which bite into a wall of the pilot opening in said substrate member to secure said strap member to said substrate member;

the aperture in said substrate member is conically-shaped with an apex adjacent a side of said substrate member on which said strap member is mounted;

the aperture in said strap member includes a conically-shaped portion which forms a continuation of the conically-shaped aperture in said substrate member; and the electrical lead is soldered to said strap member.

7. An electrical circuit assembly, which comprises:

a substrate having a pilot hole, a pair of spaced gripping surfaces and a preformed electrical termination-receiving aperture therethrough; and a planar electrically-conductive strap assembled to said substrate and having a preformed electrical termination-receiving aperture therethrough;

said strap having an orthogonally projecting cleat press-fitted and centered in the pilot hole of said substrate positioning the preformed electrcal termination-receiving aperture in said strap radially with respect to the center of the hole, said strap also having a pair of spaced gripping surfaces straddling and bearing against the gripping surfaces on said substrate in tight-fitting engagement fixing the position of the preformed electrical termination-receiving aperture in said strap in axial alignment with the preformed electrical termination-receiving aperture through said substrate, said pairs of gripping surfaces being located on opposite sides of an imaginary straight line respresentative of a preselected orientation of said strap on said substrate, with one of the pairs of gripping surfaces extending parallel to the imaginary straight line in opposite directions a distance greater than the extent of the other pair of gripping surfaces.

8. An electrical circuit assembly, as recited in claim 7, in which:

the pair of spaced gripping surfaces on said substrate are provided by a saddle defined by a pair of spaced locating holes in said substrate; and the pair of spaced gripping surfaces on said strap are provided by a pair of orthogonally projecting second cleats on said strap spaced apart and received in the locating holes in said substrate and bearing against the gripping surfaces of said saddle, the gripping surfaces of said saddle extending parallel to the imaginary straight line representative of the preselected orientation of said strap on said substrate in opposite directions a distance greater than the extent of said cleats.

9. An electrical circuit assembly, as recited in claim 8, in which:

said strap includes an elongated body;

said orthogonally projecting first cleat is located adjacent one end of said elongated body and has planar surfaces intersecting to define edges biting into a wall of the pilot hole in said substrate to secure and center said cleat within the hole; and said pair of orthogonally projecting second cleats are located adjacent the opposite end of said elongated body.

10. An electrical circuit assembly, as recited in claim 7, in which:

the pair of spaced gripping surfaces on said substrate are provided by an upstanding locating projection thereon; and the pair of spaced gripping surfaces on said strap are provided by opposed walls of an elongated slot in said strap straddling and bearing against the gripping surfaces of the substrate projection, said walls of the slot extending parallel to the imaginary straight line representative of the preselected orientation of said strap on said substrate in opposite directions a distance greater than the extent of the substrate projection.

11. An electrical circuit assembly, as recited in claim 10 in which:

said strap includes an elongated body;

said orthogonally projecting cleat is located adjacent one end of said elongated body and has planar surfaces intersecting to define edges biting into the wall of the pilot hole in said substrate to secure and center said cleat within the hole; and the slot of said strap is located in said elongated body with said walls of the slot extending parallel to the longitudinal axis of said body.

* * * * *